United States Patent [19]

Okuda

[11] 4,219,199
[45] * Aug. 26, 1980

[54] DIAMOND WITH MOLYBDENUM BONDED THERETO

[76] Inventor: Kazumi Okuda, No. 14-10-302, 2-chome, Sangenjaya, Setagaya-ku, Tokyo, Japan

[*] Notice: The portion of the term of this patent subsequent to Nov. 8, 1994, has been disclaimed.

[21] Appl. No.: 847,941

[22] Filed: Nov. 2, 1977

[30] Foreign Application Priority Data

Dec. 24, 1976 [JP] Japan ................................ 51-156000

[51] Int. Cl.$^2$ ..................... G11B 3/44; A44C 17/00
[52] U.S. Cl. ........................................ 274/38; 63/32; 204/192 C; 204/192 EC
[58] Field of Search ......... 63/32; 204/192 EC, 192 C; 274/38

[56] References Cited

U.S. PATENT DOCUMENTS

| | | | |
|---|---|---|---|
| 2,992,007 | 7/1961 | Bondley | 274/38 |
| 3,216,730 | 11/1965 | Ogura et al. | 274/38 |
| 3,654,110 | 4/1972 | Kraus | 204/192 C |
| 3,781,020 | 12/1973 | Batsch et al. | 274/38 |
| 3,945,902 | 3/1976 | Hawrylo et al. | 204/192 EC |
| 3,968,018 | 7/1976 | Lane | 204/192 EC |

FOREIGN PATENT DOCUMENTS 48-19790  6/1973  Japan ................................ 204/192 C

*Primary Examiner*—F. Barry Shay
*Attorney, Agent, or Firm*—Haseltine, Lake & Waters

[57] ABSTRACT

A diamond with molybdenum bonded or linked thereto comprises a diamond structure subjected to a pre-sputtering process by causing gaseous ions to impinge on a selected portion of its surface, and molybdenum bonded to said diamond structure, which has been subjected to said pre-sputtering process, by a sputtering process, forming a molybdenum film of 10 to 50 Å in thickness bonded or linked with the diamond and which cannot be dissolved with hydrogen peroxide. The diamond may be in the shape of a record stylus which has been soldered to a stylus holder by coating the molybdenum film with copper, or other metal suitable for cementing by solder.

8 Claims, 7 Drawing Figures

DIAMOND WITH MOLYBDENUM BONDED THERETO

BACKGROUND OF THE INVENTION

The present invention relates generally to diamonds with molybdenum bonded or linked thereto and more particularly to a diamond gem bearing a microscopic molybdenum pattern.

In general, it has been customary in the lapidary trade to provide diamonds for ornamental use and the like, for commercial transactions upon completion of cutting and polishing, with certificates of appraisal or written expert opinions on which are recorded particulars such as the numbers of carats, color grades, and presence or absence of defects (flaws) of the diamonds in order to certify and guarantee the gem quality thereof.

However, since a certificate of appraisal of this kind and the diamond described and certified thereby are separate objects, there is the risk of loss of the certificate, which therefore requires care in the custody thereof. If the certificate should be lost or destroyed, a troublesome appraisal would again become necessary, and a certificate of appraisal must be made anew.

Furthermore, there are instances of forgery of appraisal certificates. For this reason, great care must be exercised during a transaction in judging whether or not each certificate is correct and genuine. Because these appraisal certificates are thus separate from their respective diamonds, it cannot be said that they are completely reliable. For this reason, it is a fact of reality in the present state of the trade that an appraisal certificate is verified by again carrying out the above mentioned troublesome appraisal particularly during a transaction for a high-priced diamond.

Furthermore, while properties such as flaws of a diamond can be readily appraised even when it is in a mounted state on an object such as a ring, the weight in carats and the color grade of the diamond cannot be determined. For this reason, in a case where a party insists on a reappraisal of the carats and/or the color grade of such a diamond, it must be detached from its setting, which ordinarily means the destruction of the setting.

Accordingly, the present applicant has previously proposed a diamond in which a microscopic inscription having a pattern indicating the results of expert appraisal at a specific position on the outer surface of the diamond gem structure which has an outer surface cut and polished into a specific shape by U.S. Pat. application Ser. No. 672,835, now U.S. Pat. No. 4,056,952 issued Nov. 8, 1977. The inscription may be formed, as one embodiment, by a method including cleaning a selected portion of the diamond surface, depositing a layer of metal therein, coating the metal with a photoresist film, producing thereon a photo impression by using a mask, developing the impression, etching away the uncoated metal portions and then removing the photoresist.

In the above mentioned diamond proposed previously, the inscription has been formed by a metal layer deposited by evaporation as described above. The adhesive force of the metal layer to the diamond is not sufficiently strong. Accordingly, when the diamond is subjected to violent rubbing for a number of times, there arise problems in that the metal layer deposited by evaporation is peeled off from the diamond or worn out, whereby it is difficult to read the above described inscription mark.

The present applicant has made a number of experiments by changing the kind of metal to be deposited by evaporation, however, no appropriate metal layer having a high adhesive force with respect to the diamond has been found.

SUMMARY OF THE INVENTION

Accordingly, it is a general object of the present invention to provide novel and useful diamonds with molybdenum bonded thereto which solve the above described problems.

Another object of the present invention is to provide diamonds to which molybdenum has been bonded or linked with extremely large bonding force through a special sputtering process. The molybdenum bonded or linked to this diamond is not worn out or peeled off, even if it is subjected to violent rubbing for a number of times, but is bonded semipermanently. The present invention is particularly suitable for the case of bearing the result of appraisal of the diamonds, special letter for discrimination or identification, figure etc., in a microscopic pattern without any impairment whatsoever of the ornamental function of the diamond.

Other objects and further features of the present invention will be apparent from the following detailed description set forth in conjunction with the accompanying drawings.

DETAILED DESCRIPTION

Figure 1:
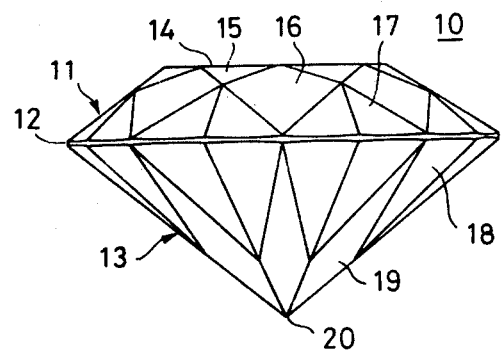
FIG. 1 is a side view showing one example of a diamond gem to which the present invention can be applied.
Figure 2:
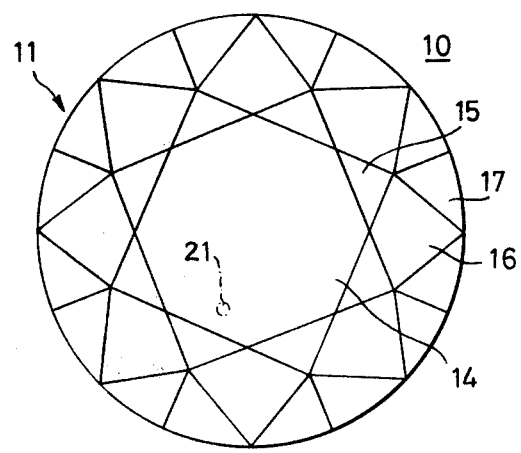
FIG. 2 is a plan view of the diamond gem shown in FIG. 1.
Figure 4:
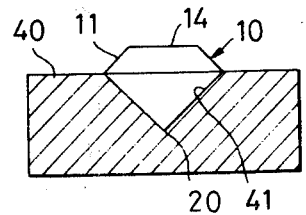
FIG. 4 is an elevational view, partly in section, indicating a state where a diamond gem is supported by a holder.

A brilliant cut diamond, which will be taken as one example of a diamond on which an inscription is to be formed in accordance with the present invention, has a shape as indicated in FIGS. 1 and 2. The diamond has a structure 10 that comprises a crown 11, a girdle 12, and a pavilion 13. The crown 11 has a table surface 14, star facets 15, bezel facets 16, and crown girdle facets 17. The pavilion 13 has pavilion girdle facets 18, pavilion facets 19, and a culet 20. These surfaces are cut and polished surfaces. In an embodiment of the invention, an inscription is formed within a part 21 on the table surface 14 of the diamond.

Figure 3:
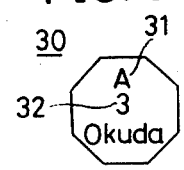
FIG. 3 is a plan view showing one example of a photomask having a pattern in accordance with an inscription to be formed on a diamond.

As a first step in this inscription forming process, a photomask 30 of a pattern as shown in FIG. 3, for example, is formed by an ordinary photographic technique or photo-etching technique. This photomask 30 is designed to indicate an inscription comprising marks 31, numerals 32, and the like representing necessary appraisal particulars of the diamond such as carat number, color grade, and presence or absence of flaws, which have resulted from an appraisal. In this connection, the pattern of the photomask 30 is of a size which is reduced in size, for example, to approximately 1/25 of the original pattern.

On one hand, the diamond 10 on which the inscription is to be formed is placed with its culet 20 down and its table 14 up in a recess 41 of a holder 40 made of, for example, stainless steel.

The recess 41 of the holder 40 has such a shape that the pavilion 13 of the diamond 10 intimately and closely fits thereinto, and the crown 11 of the diamond 10 is exposed above the holder 40.

Figure 5:
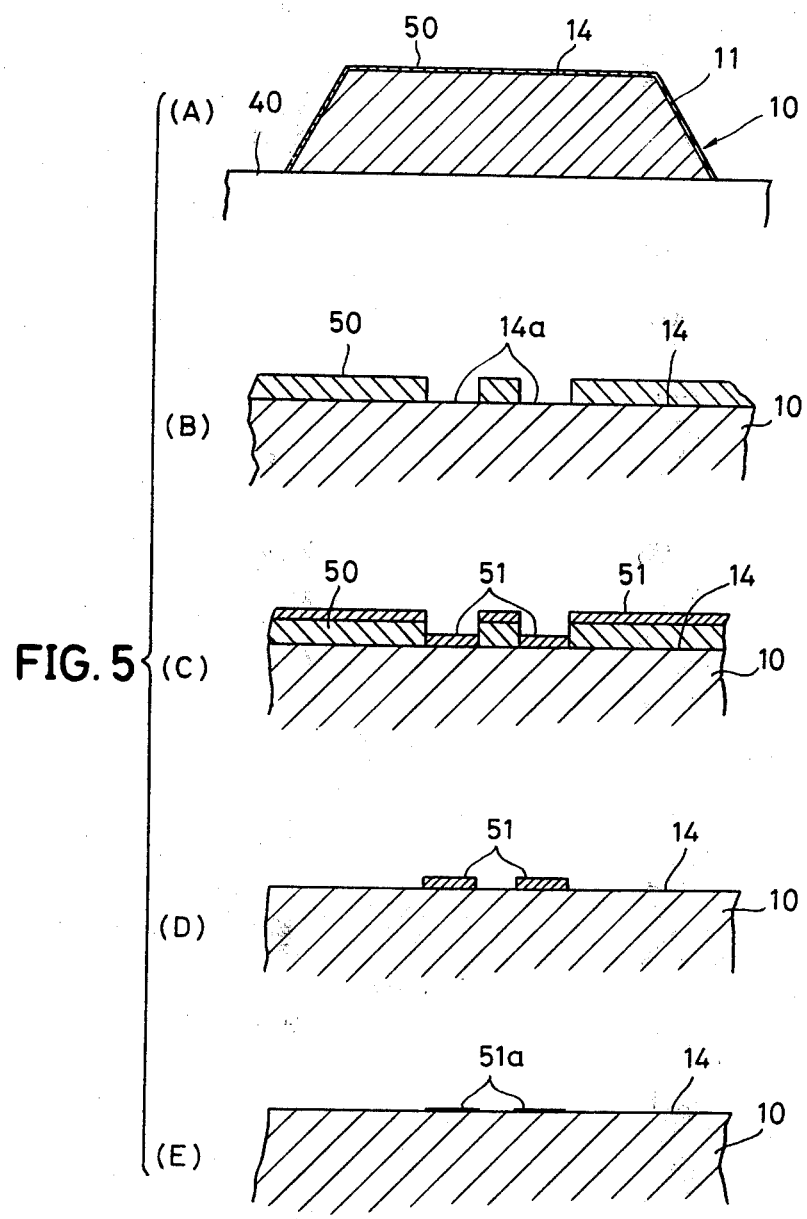
FIG. 5(A) through FIG. 5(E) are enlarged elevational views, partly in section, respectively indicating diamonds in each step of producing a diamond with molybdenum bonded thereto according to the process of the present invention.

On the crown 11 including at least the table surface 14 of the diamond 10 supported in the holder 40, a photoresist is applied as a coating to form a photoresist film 50 as shown in FIG.5(A). Then, by means of an optical system at an intermediate point of which the aforementioned photomask 30 is mounted, the pattern of the photomask 30 is reduced in size, for example, to approximately 1/80 (that is, being reduced in size to approximately 1/2,000 in compared with the original pattern) and projected on this photoresist film 50 thereby to effect photographic exposure. Thereafter, as indicated in FIG.5(B), the photoresist film 50 is developed, and parts of the photoresist are removed in accordance with the exposed pattern. Microscopic portions 14a of the table surface 14 are exposed at pattern portions where the photoresist has been removed.

Figure 6:
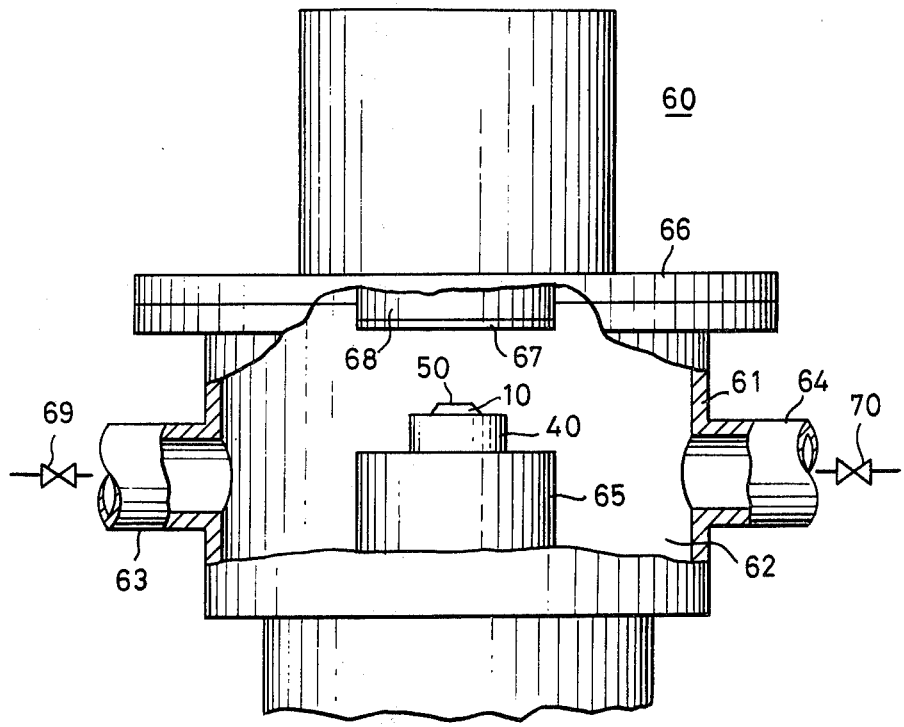
FIG. 6 is an elevation, in section, showing one embodiment of an apparatus for producing a diamond with molybdenum bonded thereto according to the present invention.

The diamond in this state is placed within a sputtering apparatus 60 indicated in FIG. 6. A main structure 61 of the sputtering apparatus 60 is communicatively connected to a vacuum pump (not shown) through an exhaust pipe 63 for discharging air from a space 62 of the main structure 61. A supply pipe 64 for supplying air into the space 62 is connected to the main structure 61. At a central part of the space 62, a substratum holder 65 is disposed. On the top of the main structure 61, a cover 66 for covering an opening thereof is provided in a freely opening and closing manner. A target holder 68 which holds a target 67 made of molybdenum (Mo) on the bottom thereof, is fixed to the cover 66 at a central part thereof. When the cover 66 is closed, the flange of the cover 66 makes close contact with the flange of the main structure 61, whereby the space 62 is maintained airtight.

As a first step in this sputtering process, a valve 69 is closed, while the valve 70 is opened for allowing air supply into the space 62 thereby to raise pressure in the space 62 to atmospheric pressure. Then, the cover 66 is opened. The holder 40 is inserted through an upper opening of the main structure 61, and the diamond 10 having a photoresist film 50 in which the pattern has been developed as indicated in FIG.5(B) is placed, together with the holder 40, on the substratum holder 65. The cover 66 is then closed to seal the space 62. In this state, the molybdenum target 67 confronts substratum holder 65 and the diamond 10.

Then, the valve 70 is closed and the valve 69 is opened, and the vacuum pump is thereafter driven to evacuate the space 62. After the degree of vacuum of the space 62 reaches a predetermined valve of the order of, for example, $5 \times 10^{-6}$ Torr to $5 \times 10^{-7}$ Torr, argon gas is introduced into the space 62. Thereafter, the substratum holder 65 is set to negative polarity and the target holder 68 to positive polarity, and, then, high electric voltage is applied therebetween. Accordingly, the diamond 10 substantially becomes a target, and ions of the argon gas impinge on the exposed table surface 14a of the diamond 10, which surface 14a is not covered by the resist film 50, whereby pre-sputtering is carried out. This pre-sputtering is considered to cause the exposed table surface 14a to be activated.

Thereafter, the substratum holder 65 is conversely set to positive polarity and the target holder 68 to negative polarity, and, then, high voltage is applied therebetween. Accordingly, the molybdenum target 67 becomes the target, and the argon gas ions impinge on the surface of the molybdenum target 67 to expel the molybdenum atoms. The molybdenum atoms thus expelled into the space are bonded to the above described exposed table surface 14a, whereby main sputtering is carried out. As this main sputtering process continues, a molybdenum coating 51 is formed on the exposed table surface 14a as indicated in FIG.5(C). The thickness forming rate of the molybdenum coating 51 is of the order of 100 to 300 Å/min.

After the molybdenum coating 51 has been formed, the valve 69 is closed and the valve 70 is opened to introduce air into the space 62. The cover 66 is then opened and the diamond 10 is taken out, together with the holder 40, from the apparatus 60. Thereafter, the photoresist film 50 is removed from the diamond 10, whereby the molybdenum coating 51 of the predetermined pattern remained on the table 14 is obtained as indicated in FIG.5(D).

Finally, the aforementioned molybdenum coating 51 is substantially removed by cleaning with hydrogen peroxide ($H_2O_2$), as needed, whereupon, a bonded molybdenum film 51a of ultra-thin thickness (approximately 10 to 50 Å) as indicated in FIG.5(E) remains. The bonded molybdenum film 51a is considered to be in a state in which molybdenum is bonded to the carbon of the diamond.

In the molybdenum coating 51, most of the molybdenum itself changes, by chemical action with the hydrogen peroxide, to molybdenum oxide, which is easily dissolved and removed. However, the bonded molybdenum film 51a is not dissolved whatsoever by the hydrogen peroxide and any other chemicals but alternatively remains with extremely large linking or bonding force to the diamond 10. The bonded molybdenum film 51a thus remaining is not peeled off and worn out whatsoever even if it is subjected to violent rubbing for a number of times. This has been ascertained by actual tests.

Moreover, depending on circumstances, all of the molybdenum of the molybdenum coating 51 may be left without being dissolved as described above. In this case, while most of the molybdenum will be worn out due to a number of rubbing actions, the aforementioned bonded molybdenum film 51a remains. Accordingly, the result becomes the same as that wherein most of the molybdenum is dissolved in advance as described hereinbefore.

While, in the case where the aforementioned main sputtering is carried out, without impinging on the exposed table surface 14a by the pre-sputtering process, to form the molybdenum coating 51, the aforementioned bonded molybdenum film 51a cannot be formed. The molybdenum film thus formed is almost worn out due to a number of rubbing actions, or is substantially dissolved away by the hydrogen peroxide, thereby being unpractical.

The position of the pattern formed by the aforementioned bonded molybdenum film 51a is not restricted to the table surface 14, but can be selected from the other surfaces of the diamond. Moreover, the pattern is also not restricted to the contents of appraisal, but may be a discrimination or identification pattern common to specific members of a society, a predetermined letter, figure, and the like.

When the indicating pattern formed by the aforementioned bonded molybdenum film 51a is to be read, it is read by means of optical magnifying means such as an interference microscope.

Figure 7:
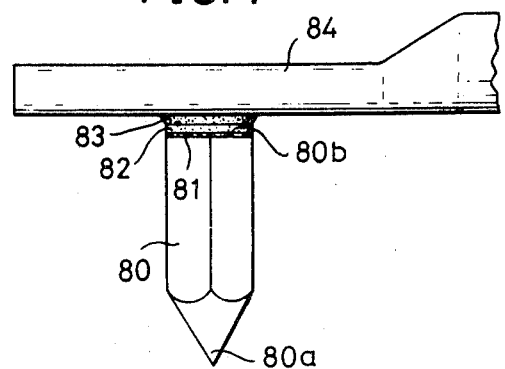
FIG. 7 is a side view showing another embodiment of a diamond with molybdenum bonded thereto according to the present invention.

Another embodiment of the diamond with molybdenum bonded thereto according to the present invention will now be described with reference to FIG. 7.

On an upper end surface 80b of a diamond stylus 80 for reproducing a record disc which stylus has a stylus tip 80a of a predetermined shape at a distal end thereof, a bonded molybdenum film 81 has been formed. This bonded molybdenum film 81 is obtained by forming the molybdenum coating by the main sputtering process of the molybdenum after the whole area of the upper surface 80b of the diamond stylus 80 is subjected to the pre-sputtering process then, and removing most of the molybdenum from the bonded molybdenum film, similarly as in the preceding process. In this embodiment the photoresist film is not used.

A layer 82 of metal such as silver and copper is formed by a sputtering process on the upper surface of the bonded molybdenum film 81. Then, the metal layer 82 is cemented to the distal end of a cantilever 84 by a solder material 83 such as a silver solder.

In accordance with this embodiment, extremely stronger cementation can be attained, in compared with the instance where the diamond stylus 80 is directly cemented to the cantilever 84 by the adhesive material.

Further, when the diamond and the metal are to be connected to each other in the other embodiment, a bonded molybdenum film is also formed. Connection of the diamond and the metal can be effected in an extremely strong manner through the bonded molybdenum film.

Moreover, since the bonded molybdenum film has conductivity, the bonded molybdenum film is also effective in the case of contacting or connecting the diamond to the other metal in an electrically, conducting manner.

Further, this invention is not limited to these embodiments but various variations and modifications may be made without departing from the scope and spirit of the invention.

What is claimed is:

1. A diamond having an exposed molybdenum film of about 10 to 50 Å in thickness bonded to at least a portion of its surface, said film incapable of being dissolved by hydrogen peroxide.

2. A diamond according to claim 1 wherein said film has a predetermined pattern.

3. A diamond according to claim 2 wherein said diamond is a gem and said pattern indicates the result of appraisal of said diamond gem.

4. A diamond having a molybdenum film bonded to at least a portion of its surface, said film being formed by subjecting said diamond surface to a pre-sputtering process wherein gaseous ions impinge thereon thereby activating said surface; by applying molybdenum to said activated surface by sputter coating, to form a coating consisting of a film of molybdenum about 10 to 50 Å in thickness bonded to the surface of the diamond and, superimposed thereon, a layer of unbonded molybdenum; and by cleaning said coating with sufficient hydrogen peroxide to remove the layer of unbonded molybdenum whereby the undissolved bonded film of molybdenum about 10 to 50 Å in thickness remains on the surface of the diamond.

5. A diamond according to claim 10 wherein at least a portion of the surface of the diamond is covered with a photoresist prior to the pre-sputtering process so that the molybdenum coating forms on only a predetermined part of said surface in a predetermined pattern.

6. A diamond according to claim 5 wherein said diamond is a gem and said pattern indicates the result of appraisal of said diamond gem.

7. A diamond according to claim 4 which has the shape of a stylus for reproducing a record disc and wherein the undissolved bonded film of molybdenum is formed on the upper end of said stylus, said film is coated by sputtering with a layer of a metal other than molybdenum suitable for cementing by solder to a stylus holding member, and said metal layer is cemented to said stylus holding member by means of said solder.

8. A diamond particle having a molybdenum film of about 10 to 50 Å in thickness bonded to at least a portion of its surface, said film incapable of being dissolved by hydrogen peroxide, said article having the shape of a stylus for reproducing a record disc and having the bonded film of molybdenum on the upper end of said stylus, said film having a layer of a metal other than molybdenum adhering directly to its surface, said metal being suitable for cementing by solder to a stylus holding member, and a stylus holding member cemented to said metal layer by means of said solder.

* * * * *